United States Patent
Picard (10) Patent No.: US 10,746,766 B2
(45) Date of Patent: Aug. 18, 2020

(54) DEVICES AND METHODS FOR DETECTING USB DEVICES ATTACHED TO A USB CHARGING PORT

(71) Applicant: Texas Instruments Incorporated, Dallas, TX (US)

(72) Inventor: Jean Picard, Hooksett, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/860,373

(22) Filed: Jan. 2, 2018

(65) Prior Publication Data
US 2018/0188297 A1    Jul. 5, 2018

Related U.S. Application Data (63) Continuation of application No. 15/431,214, filed on Feb. 13, 2017, now abandoned, which is a
(Continued)

(51) Int. Cl.
*H02J 7/00* (2006.01)
*G01R 19/165* (2006.01)
(Continued)

(52) U.S. Cl.
CPC ... *G01R 19/16533* (2013.01); *G01R 19/0092* (2013.01); *H01M 10/44* (2013.01);
(Continued)

(58) Field of Classification Search
CPC ......... G01R 19/16533; G01R 19/0092; H01M 10/44; H01M 10/48; H01M 2220/30; H02J 7/0045; H02J 7/0052; H02J 2007/0062
(Continued)

(56) References Cited

U.S. PATENT DOCUMENTS

| 6,897,773 B2 * | 5/2005 | Ridley | .................. G08B 31/00 340/506 |
|---|---|---|---|
| 7,688,037 B2 | 3/2010 | Huh | |

(Continued)

OTHER PUBLICATIONS

"Battery Charging Specification," Revision 1.1, Published Apr. 15, 2009, USB Implementers Forum, Inc, Part 1, 25 pages.
(Continued)

*Primary Examiner* — Arun C Williams
(74) *Attorney, Agent, or Firm* — Mark Allen Valetti; Charles A. Brill; Frank D. Cimino (57) ABSTRACT

Methods and devices for detecting USB devices attached to a USB charging port including a USB port having a first data line D+, a second data line D−, and a power line are disclosed. A USB device is attached to the USB port; applying power to the USB device by the power line; applying a first voltage to the line D+ at the USB port by a first impedance; applying a second voltage to the line D− at the USB port by a second impedance. The voltages on the line D+ and the line D− are then monitored at the USB port. If the voltage on the line D+ is approximately equal to a first predetermined value for a predetermined period and the voltage on the line D− is below a second predetermined value, then the USB device is determined to be of an alpha type device.

20 Claims, 3 Drawing Sheets

Related U.S. Application Data continuation of application No. 14/530,295, filed on Oct. 31, 2014, now Pat. No. 9,568,509, which is a continuation of application No. 13/298,204, filed on Nov. 16, 2011, now Pat. No. 8,890,469.

(60) Provisional application No. 61/414,780, filed on Nov. 17, 2010, provisional application No. 61/414,791, filed on Nov. 17, 2010.

(51) Int. Cl.
*H01M 10/48* (2006.01)
*G01R 19/00* (2006.01)
*H01M 10/44* (2006.01)

(52) U.S. Cl.
CPC ............... *H01M 10/48* (2013.01); *H02J 7/00* (2013.01); *H02J 7/0045* (2013.01); *H01M 2220/30* (2013.01)

(58) Field of Classification Search
USPC ........................................................ 324/649
See application file for complete search history.

(56) References Cited

U.S. PATENT DOCUMENTS

| 8,412,873 | B2* | 4/2013 | Leydier | ............... | G06F 13/4027 |
| | | | | | 710/306 |
| 2002/0040444 | A1* | 4/2002 | Ohie | .................... | G06F 1/3203 |
| | | | | | 713/322 |
| 2006/0075152 | A1* | 4/2006 | Zhu | .................... | G06F 13/4081 |
| | | | | | 710/15 |
| 2006/0236141 | A1 | 10/2006 | Chang et al. | | |
| 2008/0140887 | A1* | 6/2008 | Gallant | ............... | G06F 13/4081 |
| | | | | | 710/100 |
| 2008/0215765 | A1 | 9/2008 | Butler et al. | | |
| 2008/0265838 | A1 | 10/2008 | Garg et al. | | |
| 2008/0272741 | A1* | 11/2008 | Kanamori | ............... | G06F 1/266 |
| | | | | | 320/137 |
| 2009/0102429 | A1 | 4/2009 | Xu et al. | | |
| 2009/0130874 | A1* | 5/2009 | Englund | ............... | H01R 13/645 |
| | | | | | 439/131 |
| 2010/0064148 | A1 | 3/2010 | Ho et al. | | |
| 2010/0127864 | A1* | 5/2010 | Veselic | .................... | G06F 1/266 |
| | | | | | 340/540 |
| 2010/0201308 | A1* | 8/2010 | Lindholm | ................ | G06F 1/26 |
| | | | | | 320/107 |
| 2011/0016334 | A1 | 1/2011 | Tom et al. | | |
| 2011/0016341 | A1 | 1/2011 | Tom et al. | | |
| 2011/0043162 | A1* | 2/2011 | Lee | ....................... | H02J 7/0077 |
| | | | | | 320/107 |

OTHER PUBLICATIONS

"Battery Charging Specification," Revision 1.1, Published Apr. 15, 2009, USB Implementers Forum, Inc, Part 2, 19 pages.
"Battery Charging Specification," Revision 1.2, Published Dec. 7, 2010, USB Implementers Forum, Inc., Part 1, 25 pages.
"Battery Charging Specification," Revision 1.2, Published Dec. 7, 2010, USB Implementers Forum, Inc., Part 2, 20 pages.
"Battery Charging Specification," Revision 1.2, Published Dec. 7, 2010, USB Implementers Forum, Inc., Part 3, 16 pages.
"Battery Charging Specification," Revision 1.2, Published Dec. 7, 2010, USB Implementers Forum, Inc., Part 4, 10 pages.

* cited by examiner

DEVICES AND METHODS FOR DETECTING USB DEVICES ATTACHED TO A USB CHARGING PORT

This application is a continuation of U.S. Nonprovisional patent application Ser. No. 15/431,214, filed Feb. 13, 2017, which is a continuation of U.S. Nonprovisional application Ser. No. 14/530,295, filed Oct. 31, 2014 (now U.S. Pat. No. 9,568,509), which is a continuation of U.S. Nonprovisional patent application Ser. No. 13/298,204, filed Nov. 16, 2011 (now U.S. Pat. No. 8,890,469), which claims priority to U.S. Provisional Patent Application Nos. 61/414,780, filed on Nov. 17, 2010 and 61/414,791, filed on Nov. 17, 2010, which are incorporated herein by reference in their entirety.

BACKGROUND

Many different battery-powered devices are charged via a USB connection. Charging a battery in a USB device commences with attaching the USB device to a host device that is capable of providing current to charge the batteries in the USB device. Subsequent to attachment, a determination is made as to the type of USB device and the type of host device that are attached together. If a charging port is detected, the charging port provides current to charge the batteries in the USB device.

Over time, several different battery charging specifications have been developed for different charging ports. The different battery charging specifications have created some conflicts between different charging ports and different USB devices. Accordingly, not all battery-powered USB devices will enter a charging mode when attached to all charging ports.

DETAILED DESCRIPTION

The universal serial bus (USB) has become a dominant device for transmitting data between computers and other electronic devices. The electronic devices include peripherals, such as printers and keyboards, and portable devices, such as cellular telephones and recording devices. These electronic devices are referred to herein collectively as USB devices. The computer or other device that controls the USB is referred to as the host device or simply the host. The USB has four conductors, two power lines and two data lines. The two power lines are referred to as Vbus and ground and the two data lines are referred to as D+ and D−.

The use of the USB enables USB devices to communicate with a host and to be powered by the host while using a single USB cable. More specifically, the power lines, Vbus and ground, provide power to the USB device and the data lines, D+ and D−, provide the data communications between the host and the USB device. In the case of battery-powered USB devices, the power lines are able to charge the batteries as described in greater detail below.

Many battery-powered USB devices, such as cellular telephones use a single USB port for data communications and power. A user can recharge the batteries by attaching a USB cable between the single USB port and a host. Due to the limited power that can be output from some hosts, such as some computers, many battery-powered USB devices are charged by connecting the USB port of the USB device to a wall mounted battery charger. The wall mounted battery chargers are capable of supplying significantly more power than some computers or other hosts.

USB specifications dictate the manner in which USB devices detect battery chargers (charging ports) and the manner in which they charge. Over time, two primary specifications related to battery charging of USB devices have been developed, BC1.1 and BC1.2. The specification BC1.1 was adopted by the USB Implementers Forum in April of 2009. The specification BC1.1 was replaced by the more advanced specification BC1.2, which was adopted by the USB Implementers Forum in December of 2010. However, there are many USB devices on the market and in use that use the older specification BC1.1. Many of these USB devices that use the specification BC1.1 are not able to charge when connected to a charging port that is operating per the specification BC1.2. To complicate the matter, some manufacturers use proprietary USB charging specifications that do not operate with other USB devices or hosts.

Host devices and methods of operating host devices that enable BC1.1, BC1.2, and some proprietary USB devices to be charged from a single charging port are disclosed herein. The charging port described herein may be a dedicated charging port (DCP), a charging downstream port (CDP), or a standard downstream port (SDP). A dedicated charging port is able to provide approximately 1.5 amperes to a USB device whereas a standard downstream port may only be able to supply approximately 500-900 mA to a USB device.

Figure 1:
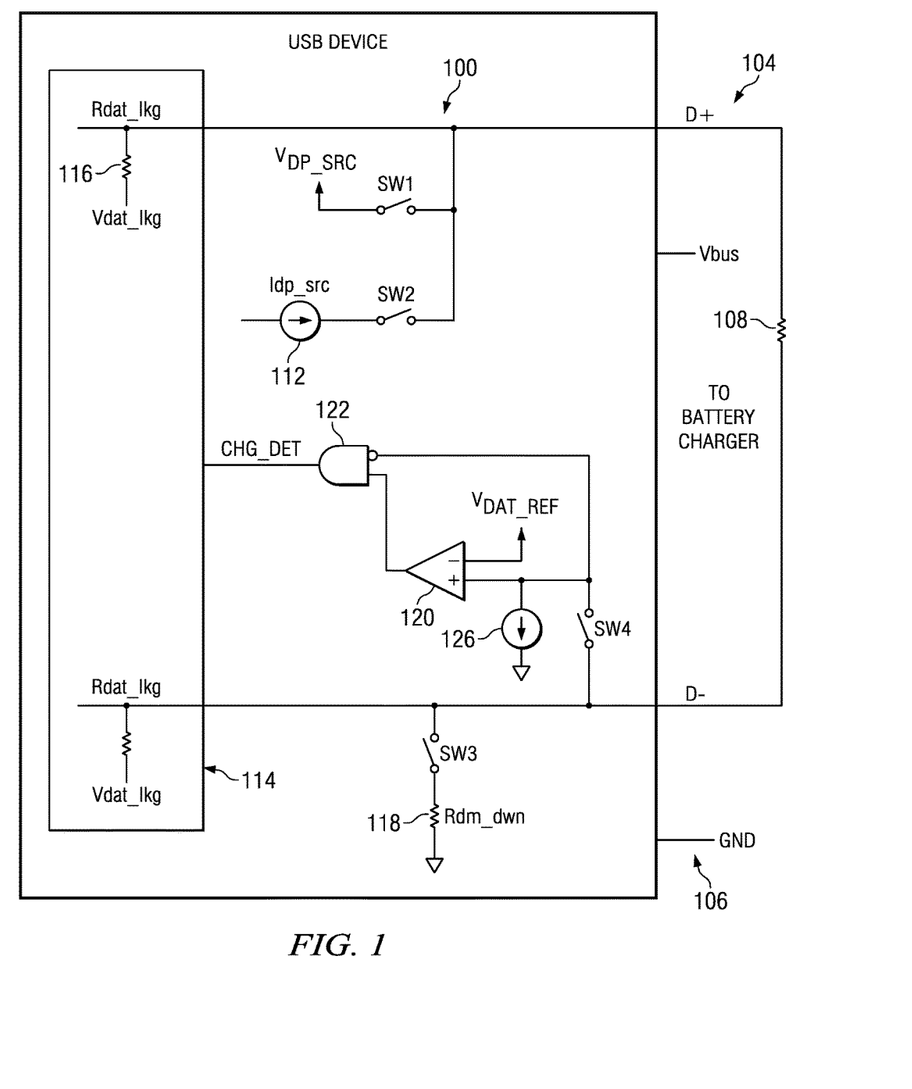
FIG. 1 is a schematic diagram of the charge detection circuit of a USB device per specification BC1.1.

Reference is made to FIG. 1, which is a schematic diagram of the charge detection circuit 100 of a USB device 104 complying with at least one version of the USB battery charging specification BC1.1. The charge detection circuit 100 is used by the USB device 104 to determine if a charging port is attached to the USB port 106 of the USB device 104 as described below. The USB device 104 is attached to a host, which is a charging port, via the USB port 106. Although the charging port is not shown in FIG. 1, the lines D+ and D− are connected to a resistor 108 that is located in the charging port as described in greater detail below. The value of the resistor 108 may be between zero and 250 ohms. Because the value of the resistor 108 is so low, it is sometimes referred to as a short between the lines D+ and D−. It is noted that the use of the resistor connected between the line D+ and D− is an example of a charging port configuration and that other circuits may be connected to the lines D+ and D−.

As briefly described above, the USB port 106 has four conductors or lines, which are referred to individually as Vbus, Ground (GND), data positive (D+), and data minus (D−). Vbus and GND are not shown connected to any components in the charge detection circuit 100. Rather, Vbus and GND are used to supply power to the USB device 104 and to charge batteries used to operate the USB device 104. The data lines D+ and D− are used to transmit data between the USB device 104 and the host. As described below, lines D+ and D− are also use to detect whether a host is attached to the USB device 104 and to indicate the type of host attached thereto.

The line D+ is connected to a voltage source VDP_SRC by way of a switch SW1. The voltage source VDP_SRC may provide a voltage between 0.5 and 0.7 volts. The line D+ is also connected to a current source 112 by way of a switch SW2. The current source 112 may provide a current of a predetermined amount, which is referred to as IDP SRC. The current source 112 may supply a current of approximately 7-12 uA. In addition, line D+ is connected to a physical layer interface (PHY) 114, which is also referred to as a USB transceiver. The connection to the physical layer interface 114 is represented by a leakage resistance 116 having a value of RDAT_LKG and a leakage voltage, which is referred to as VDAT_LKG. The values of RDAT_LKG may be approximately 300 k ohms and the value of VDAT_LKG may be between zero and 3.6 volts.

The line D− is connected to a pull down resistor 118 by a switch SW3. The resistor 118 has a value referred to as RDM_DWN, which may have a value of between 14.25 k ohms and 24.8 k ohms. The line D− is also connected to the non-inverting side of a voltage comparator 120 and an inverting input of an AND gate 122 by a switch SW4. The non-inverting input of the voltage comparator 120 is also connected to a current sink 126. The current sink 126 is sometimes referred to as being activated when the switch SW4 closes. As with the line D+, the line D− is also connected to the physical layer interface 114 wherein the connection is represented by the leakage resistance Rdat_lkg and the leakage voltage Vdat_lkg.

The inverting input of the voltage comparator 120 is connected to a reference voltage VDAT_REF, which may be between 0.25 and 0.4 volts. Accordingly, the voltage comparator 120 compares the voltage on line D− to the reference voltage VDAT_REF. The output of the voltage comparator 120 is an input to the AND gate 122. The output of the AND gate 122 provides a signal to the physical layer interface 114 as to whether a charging port has been connected to the USB device 104. A high value from the AND gate 122 is indicative of a charging port connected to the USB device 104.

Having described the USB device 104, its operation for detecting an attachment to a charging port will now be described. The USB device 104 first detects that a USB cable is attached by way of a procedure sometimes referred to as "VBUS detect". This detection may be achieved by conventional methods of monitoring Vbus. For example, when the voltage on Vbus transitions to a value higher than 0.8V, it is indicative of a USB cable being attached to the USB device 104. When the USB cable is determined to be attached to the USB device 104, the USB device is sometimes referred to as being in "session valid".

When the attachment has been established and the USB device is in session valid, a "data contact detect" is performed, which determines when the lines D+ and D− are electrically connected to the host. In summary, a data contact detect occurs after the session valid when the voltage on the line D+ goes low. In a BC1.1 device, the current source 112 is activated by closing switch SW2. In addition, switch SW3 is closed, which connects the line D− to ground via the resistor 118. In some host devices, the host device will pull the voltage on the line D+ low by way of a pull down resistor in the host device. In other devices, the host will connect the line D+ to the line D−. Because the line D− is pulled down by the resistor 118, the line D+ will go low when the host device is connected to the USB device 104. In any event, data contact detect occurs when the voltage on the line D+ goes low after session valid.

USB devices per BC1.1 do not have a time out procedure if they do not detect that the voltage on line D+ has gone low after a session valid. If the voltage on the line D+ is driven high by the charging port, the BC1.1 device will never be able to obtain a data contact detect. BC1.2 devices do not have this issue because they will skip the data contact detection and move on to the primary detection, described below, after a period. The charging port and methods of operating the charging port described herein monitor the lines D− and D+. If the line D− is pulled down while the line D+ is not pulled down, the charging port determines that the connected device is a BC1.1 device and proceeds to a dedicated charging port mode per BC1.1.

When data contact detect is complete, the USB device 104 proceeds to determine if the host is a charging port by performing a "primary detection". The USB device 104 closes switch SW1, which turns on the voltage source 110. The switch SW4 is also closed, which connects the current sink 126 to the line D−. If a host other than a charging port is attached to the line D−, the host pulls the voltage on the line D− below the voltage VDAT_REF, so the CHG_DET line is low, indicating that no charging port is connected to the USB port 106. If the voltage on line D− is greater than the voltage VDAT_REF and below a logic one voltage, then the CHG_DET line is high indicating that the USB device 104 is attached to a charging port.

A USB device under BC1.1 may have problems if the line D− is driven high by the host device and the USB device was able to pass beyond the data contact detect. By driving the line D− too high, it could be interpreted as a logic high by the AND gate 122 and drive the charge detection line CHG_DET low, so the USB device 104 detects that no charging port is connected. In such a situation, the host described herein may determine that the USB device 104 is a BC1.1 device. In order to proceed with charging, the power may be removed from the USB device and a shorting resistor may be connected between D+ and D− by the host device which indicates to the USB device 104 that a charging port is attached thereto.

Some other USB devices are somewhat different than the BC1.1 devices and may conflict with BC1.1 devices. For example, one manufacturer produces USB devices and corresponding charging ports or adapters (referred to herein collectively as charging ports) that use different charge and charge detection specifications. In these specifications, the charging ports output specific voltages through predefined impedances on the lines D+ and D− that are indicative of the type of charging port connected to the USB device. It follows that this manufacturer produces USB devices that monitor the voltages on the lines D+ and D− to determine the type of charging port that is connected thereto. In one embodiment of these devices, a voltage of approximately 2.7 volts is output on the line D− and a voltage of approximately 2.0 volts is output on the line on D+. The voltage configuration indicates that the charging port is configured for a first type of USB device that charges per a specific charging specification. However, a second type of charging port outputs approximately 2.0 volts on the line D− and approximately 2.7 volts on the line D+. This voltage configuration is indicative of a charging port configured for a second type of USB device. The second type of USB device may draw significantly more current during battery charging than the first type of USB device.

Many of the BC1.1 USB devices are not able to recognize the charging port from the above-described manufacturer. When the above-described charging port is attached to the BC1.1 device, the line D+ is driven high by the charging port. Accordingly, the BC1.1 device cannot proceed with the data contact detect because the voltage on the line D+ will never go low. In addition, the charging ports drive the voltage on the line D− to a voltage that may be high enough to where it could be a logic high. In doing so, the CHRG_DET line is driven to a logic low. If the BC1.1 USB devices are able to proceed beyond data contact detect, they may not recognize that a charging port is attached thereto and do not enter a charging mode. Accordingly, the BC1.1 USB devices are attached to charging ports, but they do not charge their batteries.

A schematic diagram of a USB charging port 200 that can determine if a USB device is a BC1.1 device or if the USB device is of a manufacturer using a different charging specification as described above is shown in FIG. 2.

Figure 2:
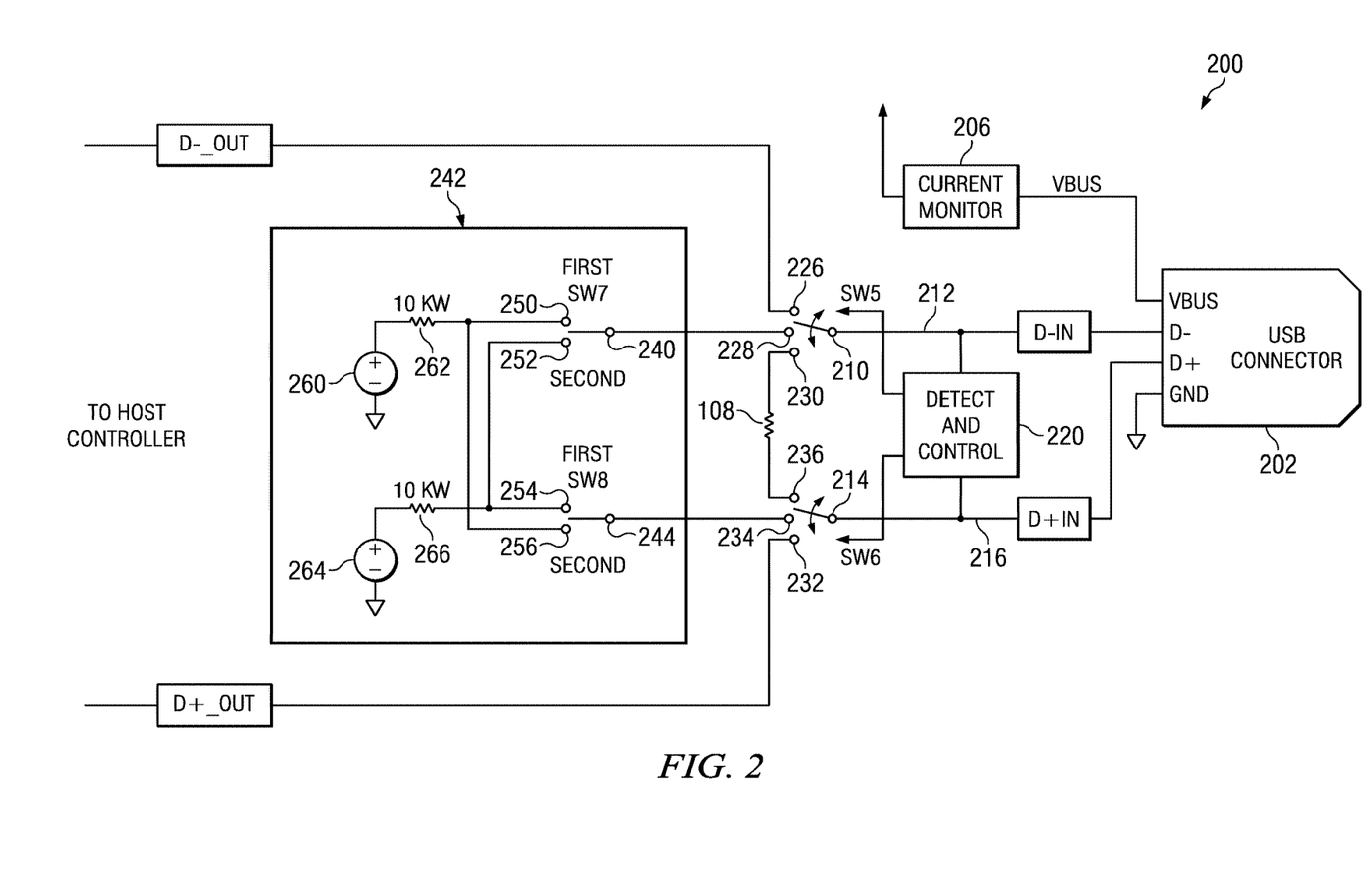
FIG. 2 is a schematic diagram of an embodiment of a USB charging port.

The charging port 200 has a USB port 202 that is attachable to a USB cable, which in turn is attachable to the USB port 106 on the USB device 104. The USB port 202 includes the same lines as described above, VBUS, GND, D+, and D−. The line VBUS is connected to a current monitor 206 that monitors the current flowing in the line VBUS. Accordingly, the current monitor 206 monitors the current used by the USB device when it is charging. The GND line is connected to a conventional ground.

The line D− is connected to a node 210 on a switch SW5 by way of a line 212. The line D+ is connected to a node 214 on a switch SW6 by way of a line 216. The switches SW5 and SW6 may be separate as shown in FIG. 2, or they may be a single switch. Detection and controls circuits 220 are connected between the line 212 and the line 216. The detection and control circuits 220 may measure the voltages on the lines 212 and 216 and control the state of the switches SW5 and SW6.

The switch SW5 has three contacts, which are referred to individually as the first contact 226, the second contact 228, and the third contact 230. The contacts 226, 228, 230 are connectable to the node 210. In some embodiments, the switch SW5 is an electronic switch. The switch SW6 is very similar to the switch SW5 and has three contacts, a first contact 232, a second contact 234, and a third contact 236. The contacts 232, 234, 236 are connectable to the node 214. The switch SW6 may also be an electronic switch.

The first node 226 of the switch SW5 is connected to the line D− of a host controller 240. The host controller may be a conventional host controller that transmits and receives data on the lines D+ and D−. The first contact 232 of the switch SW6 is connected to the line D+ of the host controller. The second contact 228 of the switch SW5 is connected to a node 240 of a switch SW7 that is part of a power supply 242. The power supply 242 applies voltages onto the lines D+ and D− as described below. The second contact 234 of the switch SW6 is connected to a node 244 of a switch SW8 that is also part of the power supply 242.

The third contact 230 of the switch SW5 is connected to a resistor 108, which is the same resistor 108 of FIG. 1. The third contact 236 of the switch SW6 is also connected to the resistor 108. It follows that when the switches SW5 and SW6 are connected to the third contacts 230, 236, the resistor 108 is connected between the data lines D+ and D−. Such a configuration is indicative to a BC1.1 and a BC1.2 USB device that it is connected to a charging port as described above.

The power supply 242 will now be described. The switch SW7 has a first contact 250 and a second contact 252. The switch SW8 has a first contact 254 and a second contact 256. The first contact 250 of the switch SW7 is connected to the second contact 256 of the switch SW8. The first contact 250 of the switch SW7 is also connected to a first voltage source 260 by way of a resistor 262. The first voltage source 260 supplies a voltage of approximately 2.7 volts. In the embodiment of the power supply 242 described herein, value of the resistor 262 is approximately 10 k ohms; however, the value of the resistor 262 may be different. The first contact of the switch SW8 is connected to the second contact 252 of the switch SW7. The first contact 254 of the switch SW8 is also connected to a second voltage source 264 by way of a resistor 266. The second voltage source 264 outputs a voltage of approximately 2.0 volts and the value of the resistor 266 is approximately 10 k ohms. As with the resistor 262, the value of the resistor 266 may be different than 10 k ohms. The voltages described above refer to an embodiment of a charging port. It is noted that other voltage values may be used in different embodiments.

The switches SW7 and SW8 are in a first mode when the nodes 240, 244 are connected to the first ports 250, 254. In the first mode, the voltage of the first voltage source 260 is output on the node 240 and the voltage of the second voltage source 264 is output on the node 244. The switches SW7 and SW8 are in a second mode when the nodes 240, 244 are connected to the second ports 252, 256. When the switches SW7, SW8 are in the second mode, the voltage from the first voltage source 260 is output on the node 244 and the voltage from the second voltage source 264 is output on the node 240.

Figure 3:
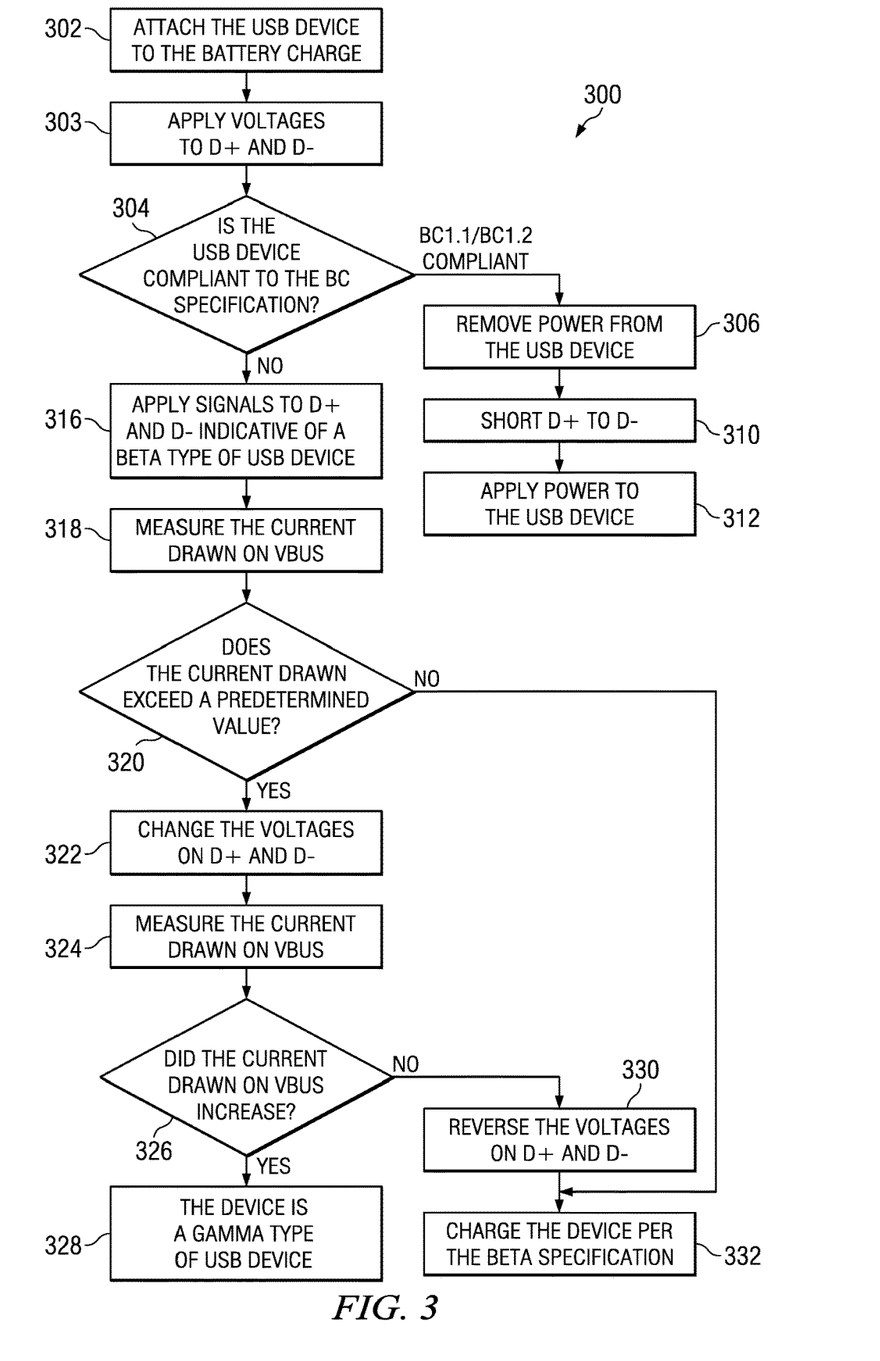
FIG. 3 is a flow chart describing the operation of the charging port of FIG. 2.

The operation of the charging port 200 will now be described with additional reference to the flow chart 300 of FIG. 3, which describes the operation of the power supply 200.

As described above, there are different USB devices to which the charging port 200 may be attached, therefore, the charging port has to determine which type of USB device it is attached to. Unlike the protocol of the BC1.1 and BC1.2 specifications, the manufacturer described above outputs voltages on the lines D+ and D− from the charging port. The USB device measures the voltages on the lines D+ and D−. If the line D+ is approximately 2.0 volts and the voltage on the line D− is approximately 2.7 volts, the USB device determines that it is connected to a first type of charging port that is able to output a first level of current. If the voltage on line D− is approximately 2.0 volts and the voltage on line D+ is approximately 2.7 volts, then the USB device determines that a second type of charging port is connected wherein the second type of charging port is able to supply more current than the first type of charging port. As described below, the charging port 200 described herein is able to be used with both types of USB devices.

The first step in battery charging is to attach the USB device 104 to the charging port as shown in step 302 of the flow chart 300. The above-described VBUS detect is then performed.

The next step is to determine if a BC1.1 or BC1.2 compliant USB device is attached to the charging port 200 as described in step 304 of flow chart 300. A BC1.1 device is sometimes referred to as an alpha device. As described above, a USB device that is compliant with BC1.1 or BC1.2 will sink the current on the data line D− to ground or pull down the voltage on the voltage on the line D−. It follows that the voltage on the line D− measured at the detect and control circuit 220 will be below what it should be without the current sink 126 or the pull down resistor 118 connected thereto. The line D+ on a BC1.1 or BC1.2 device is connected to the voltage supply 110, which sources (but does not sink) between 0.5 and 0.75 volts. The voltages on these lines can be measured by the detection and control circuits 220. If the voltage on the line D− is less than what it would be but for the current sink, and the charging voltage present on the line D+ is maintained, then the USB device is likely compliant with BC1.1. The period that the line D+ is maintained may be greater than 1.5 seconds. In other embodiments, the period may be greater than or approximately equal to 0.25 seconds.

When applied specifically to the charging port 200, voltages are applied to the lines D+ and D− via the power supply 242, as described in step 303, and the voltages on lines D+ and D− are measured at the detection and control circuits 220. The voltage on line D+ should be high because the voltage supply 110 can only source a current. For example, if the power supply 264 applies approximately 2.0 volts on the line D+, the detection and control circuit 220 should measure approximately 2.0 volts. The voltage on line D− should be lower than the voltage supplied by the power supply 242 because the USB device 104 sinks the line D− to ground. Applying the voltages to the lines D+ and D− is achieved by connecting the node 210 to the second port 228 and connecting the node 214 to the second port 234. The lines D+ and D− are then connected to the voltage sources 260, 264 by way of the impedances 262, 266. The power supply 242 can be placed in the first mode so that 2.7 volts is applied to the line D− and 2.0 volts is applied to the line D+.

As briefly described above, the voltages on the lines D+ and D− are measured by the detection and control circuits 220. The voltage on the line D+ should be about 2.0 volts, or within a predetermined range of 2.0 volts, such as 1.9 to 2.1 volts. The voltage on the line D− should be lower than the voltage applied by the voltage supply 242. For example, the voltage may be less than approximately 2.4 volts. In some embodiments, the voltage on the line D− may be less than 2.6 volts or it may be less than 0.1 volts less than the voltage supplied by the voltage source 260. If these criteria are met and maintained for a predetermined period, the charging port 200 determines that the USB device is compliant per BC1.1, which is sometimes referred to as being an alpha device. The processing then proceeds to step 306 of the flow chart 300. Otherwise, the USB device has a charging specification of another manufacturer and processing proceeds to step 308 of the flowchart 300.

If the USB device is compliant per BC1.1, the charging port 200 will set the correct battery charging specifications for such a device. In the embodiment of the charging port 200 described herein, the resistor 108 will be connected between the lines D+ and D− to indicate that the charging port 200 is a charging port per BC1.1. In order to recycle the USB device, step 306 removes the power from the USB device. This may be achieved by disconnecting VBUS from the USB device. By recycling the USB device 104, the process of determining the type of USB device connected to the charging port starts over with the resistor 108 connected between the lines D+ and D−.

Connecting the resistor 108 to the lines D+ and D− is performed by setting the switch SW5 for the node 210 to connect to the third contact 230. Likewise, the switch SW6 is set for the node 214 to connect to the third contact 236. In this mode, the line D+ is essentially shorted to the line D− because they are connected by the resistor 108 as described in step 310 of the flow chart 300. Power is then returned to the USB device by the charging port 200 as described in step 312 of the flow chart 300. Because the lines D− and D+ are shorted, the USB device will recognize the charging port 200 correctly as a dedicated charging port and will charge the battery per a battery charging specification.

Returning to step 304 of the flow chart 300, the USB device may have been determined to be from a manufacturer that does not comply with the above-described battery charging specifications. Rather, the manufacturer uses a specification wherein voltages are applied to the lines D+ and D− by the charging port to indicate that it is a dedicated battery charger, per a proprietary specification as described above. The USB device measures the voltages on the lines D+ and D− to determine that a dedicated charging port is connected and then the USB device commences charging.

In the embodiments described herein, the manufacturer has a first or older specification for older USB devices that draw lower current than newer USB devices using a newer or second specification. For reference purposes, the older USB devices that draw less current are referred to as beta devices and the newer USB devices that draw more current are referred to as gamma devices. The older devices may draw less than 550 mA and the newer devices may draw approximately 2.0 amperes. Older charging ports may not be able to supply the current required to charge the newer devices. However, the newer USB devices may recognize the older charging ports and may, upon detection of an older charging port, limit their current draw to the lower current supplied by the older charging ports. The charging port 200 described herein is able to detect whether the manufacturer's USB device is an older type that draws less current than a newer type and to supply the appropriate current.

The process of determining the type of device commences with applying voltages from the charging port 200 to the USB device via the lines D+ and D− indicating that the charging port 200 is configured for an older USB device that draws less current than a newer USB device. This first step is shown at step 316 of the flow chart 300. In the embodiment of the charging port 200 of FIG. 2, this first step is accomplished by connecting the first voltage source 260 to the line D− and connecting the second voltage source 264 to the line D+. More specifically, the switches SW7 and SW8 are placed in the first mode and the nodes 210, 214 are connected to the second ports 228, 234. Accordingly, 2.7 volts is output on the line D− and 2.0 volts is output on the line D+.

The current drawn from the charging port 200 is measured at step 318. More specifically, the current drawn on VBUS to charge the USB device is measured by the current monitor 206. A decision is made at step 320 to determine if the current drawn is greater than a predetermined value. If the current drawn is greater than a predetermined value, the USB device is likely a second or newer type of device and processing proceeds to step 322 where the voltages on D+ and D− are swapped. In some embodiments, the predetermined current value is approximately 750 mA. With regard to the charging port 200, the states of the switches SW7 and SW8 are changed. At step 324, the current drawn on VBUS is measured again. Because the charging port 200 is in a state to provide high current to a newer USB device, the current drawn on VBUS should increase if the USB device is a newer type device. For example, the current drawn may increase to approximately 900 mA or greater.

A decision as to whether the current drawn on VBUS has increased is shown at step 326 of the flow chart 300. If the current has increased, the USB device is a newer type device and needs the higher current provided by the present configuration of the charging port 200. The voltages on the lines D+ and D− remain at 2.7 and 2.0 volts respectively, and the charging port 200 provides charging power per the specification of the newer USB device.

If, at step 326, the current drawn by the USB device did not increase, the USB device is an older device, so the voltages on D+ and D− are set to reflect the older device as described in step 330. The charging port 200 then commences to charge the USB device per the older charging specification as described in step 332. It is also noted that if the decision from step 320 is negative, the USB device is an older device and will charge per the older specifications as described in step 332.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A device comprising:
   a first data input and a first data line coupled to the first data input;
   a second data input and a second data line coupled to the second data input;
   a power terminal and a power line selectively coupled to the power terminal;
   a first voltage source and a second voltage source;
   a first switch having a first switch position configured to couple the first data line to the first voltage source, and a second switch position configured to couple the first data line to the second voltage source; and
   a second switch having a first switch position configured to couple the second data line to the second voltage source, and a second switch position configured to couple the second data line to the first voltage source.

2. The device of claim 1, wherein the first data input is adapted to be coupled to a D+ data line of a Universal Serial Bus (USB) connector of a battery-powered device, and the second data input is adapted to be coupled to a D− data line of the USB connector of the battery-powered device.

3. The device of claim 1, further comprising:
   a current monitor coupled to the power terminal for monitoring a current conducted by the power line.

4. The device of claim 3, wherein the power terminal is adapted to be coupled to a VBUS power line of a Universal Serial Bus (USB) connector of a battery-powered device.

5. The device of claim 1, wherein the first voltage source is configured to provide a first voltage to the first data line when the first switch is at the first switch position, and the second voltage source is configured to provide a second voltage, lower than the first voltage, to the second data line when the second switch is at the first switch position.

6. The device of claim 1, wherein the first voltage source is configured to provide a first voltage to the second data line when the first switch is at the second switch position, and the second voltage source is configured to provide second voltage, lower than the first voltage, to the first data line when the second switch is at the second switch position.

7. The device of claim 1, further comprising:
   a first data output and a second data output;
   a resistor having a first end and a second end;
   a switch circuit having:
      a first selection configured to couple the first data input to the first data output, and configured to couple the second data input to the second data output;
      a second selection configured to couple the first data input to the first switch, and configured to couple the second data input to the second switch; and
      a third selection configured to couple the first data input to the first end of the resistor, and configured to couple the second data input to the second end of the resistor.

8. The device of claim 7, wherein the first selection of the switch circuit is configured to decouple the first data input from the first switch, and configured to decouple the second data input from the second switch.

9. The device of claim 7, wherein the third selection of the switch circuit is configured to decouple the first data input from the first switch, and configured to decouple the second data input from the second switch.

10. The device of claim 7, further comprising:
    a detect circuit coupled between the first and second data inputs, the detect circuit configured to:
       enable the second selection of the switch circuit;
       detect a first test voltage from the first data input and a second test voltage from the second data input; and
       enable the third selection of the switch circuit upon detecting the first test voltage to be within a predefined range of a second voltage of the second voltage source, and the second test voltage to be lower than a first voltage of the first voltage source.

11. A Universal Serial Bus (USB) device, comprising:
    a first data input adapted to be coupled to a D+ data line of a USB connector of a battery-powered device;
    a second data input adapted to be coupled to a D− data line of the USB connector of the battery-powered device;
    a power terminal adapted to be coupled to a VBUS power line of the USB connector of the battery-powered device;
    a first voltage source and a second voltage source;
    a first switch having a first switch position configured to couple the first data input to the first voltage source, and a second switch position configured to couple the first data input to the second voltage source; and
    a second switch having a first switch position configured to couple the second data input to the second voltage source, and a second switch position configured to couple the second data input to the first voltage source.

12. The USB device of claim 11, wherein the first voltage source is configured to provide a first voltage to the first data line when the first switch is at the first switch position, and the second voltage source is configured to provide a second voltage, lower than the first voltage, to the second data line when the second switch is at the first switch position.

13. The USB device of claim 11, wherein the first voltage source is configured to provide a first voltage to the second data line when the first switch is at the second switch position, and the second voltage source is configured to provide second voltage, lower than the first voltage, to the first data line when the second switch is at the second switch position.

14. The USB device of claim 11, further comprising:
    a first data output and a second data output;
    a resistor having a first end and a second end;
    a switch circuit having:
       a first selection configured to couple the first data input to the first data output, and configured to couple the second data input to the second data output;
       a second selection configured to couple the first data input to the first switch, and configured to couple the second data input to the second switch; and
       a third selection configured to couple the first data input to the first end of the resistor, and configured to couple the second data input to the second end of the resistor.

15. The USB device of claim 14, wherein the first selection of the switch circuit is configured to decouple the first data input from the first switch, and configured to decouple the second data input from the second switch.

16. The USB device of claim 14, wherein the third selection of the switch circuit is configured to decouple the first data input from the first switch, and configured to decouple the second data input from the second switch.

17. The USB device of claim 14, further comprising:
a detect circuit coupled between the first and second data inputs, the detect circuit configured to:
  enable the second selection of the switch circuit;
  detect a first test voltage from the first data input and a second test voltage from the second data input; and
  enable the third selection of the switch circuit upon detecting the first test voltage to be within a predefined range of a second voltage of the second voltage source, and the second test voltage to be lower than a first voltage of the first voltage source.

18. A Universal Serial Bus (USB) device, comprising:
a first data input adapted to be coupled to a D+ data line of a USB connector of a battery-powered device;
a second data input adapted to be coupled to a D− data line of the USB connector of the battery-powered device;
a first voltage source and a second voltage source;
a resistor having a first end and a second end;
a switch circuit having:
  a first selection configured to couple the first data input to the second voltage source, and configured to couple the second data input to the first voltage source; and
  a second selection configured to couple the first data input to the first end of the resistor, and configured to couple the second data input to the second end of the resistor; and a detect circuit configured to:
  enable the first selection of the switch circuit;
  detect a first test voltage from the first data input and a second test voltage from the second data input; and
  enable the second selection of the switch circuit upon detecting the first test voltage to be within a predefined range of a second voltage of the second voltage source, and the second test voltage to be lower than a first voltage of the first voltage source.

19. The USB device of claim 18, wherein the switch circuit includes:
a first switch having a first switch position configured to couple the first data input to the first voltage source, and a second switch position configured to couple the first data input to the second voltage source; and
a second switch having a first switch position configured to couple the second data input to the second voltage source, and a second switch position configured to couple the second data input to the first voltage source.

20. The USB device of claim 18, wherein the first voltage is 2.0 volts, the second voltage is 2.7 volts, and the predefined range is between 1.9 volts and 2.1 volts.

* * * * *